United States Patent
Lee (10) Patent No.: US 9,397,024 B2
(45) Date of Patent: Jul. 19, 2016

(54) SEMICONDUCTOR DEVICES WITH OPTICAL THROUGH VIA STRUCTURES, MEMORY CARDS INCLUDING THE SAME, AND ELECTRONIC SYSTEMS INCLUDING THE SAME

(71) Applicant: SK hynix Inc., Icheon-si Gyeonggi-do (KR)

(72) Inventor: Seung Yeop Lee, Suwon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 57 days.

(21) Appl. No.: 14/520,496

(22) Filed: Oct. 22, 2014

(65) Prior Publication Data
US 2016/0035649 A1  Feb. 4, 2016

(30) Foreign Application Priority Data
Jul. 30, 2014  (KR) ................ 10-2014-0097658

(51) Int. Cl.
| H04B 10/00 | (2013.01) |
| H01L 23/48 | (2006.01) |
| H04B 10/43 | (2013.01) |
| G02B 6/42 | (2006.01) |
| H04J 14/00 | (2006.01) |

(52) U.S. Cl.
CPC ............ *H01L 23/481* (2013.01); *G02B 6/4201* (2013.01); *H04B 10/43* (2013.01); *H01L 2224/16145* (2013.01)

(58) Field of Classification Search
CPC ................... G02B 6/3608; G02B 6/43
See application file for complete search history.

(56) References Cited

U.S. PATENT DOCUMENTS
| 2004/0091719 A1* | 5/2004 | Uchida ............... H05K 1/0274 428/429 |
| 2013/0320359 A1 | 12/2013 | Hummler |

FOREIGN PATENT DOCUMENTS
KR  1020110135145 A  12/2011

* cited by examiner

*Primary Examiner* — Daniel Dobson
(74) *Attorney, Agent, or Firm* — William Park & Associates Ltd.

(57) ABSTRACT

A semiconductor device is provided. The semiconductor device may include a substrate and a through via structure penetrating the substrate. The through via structure may provide a dual path that may include an electrical path and an optical path. Related electronic systems and memory cards are also provided.

18 Claims, 10 Drawing Sheets

SEMICONDUCTOR DEVICES WITH OPTICAL THROUGH VIA STRUCTURES, MEMORY CARDS INCLUDING THE SAME, AND ELECTRONIC SYSTEMS INCLUDING THE SAME

CROSS-REFERENCE TO RELATED APPLICATION

The present application claims priority under 35 U.S.C. 119(a) to Korean Application No. 10-2014-0097658, filed on Jul. 30, 2014, in the Korean intellectual property Office, which is incorporated herein by reference in its entirety.

BACKGROUND

1. Technical Field

Embodiments of the present disclosure generally relate to semiconductor devices and, more particularly, to semiconductor devices with optical through via structures, memory cards including the same and electronic systems including the same.

2. Related Art

Semiconductor devices may employ through via structures as electric signal paths. The through via structures may include through silicon via (TSV) electrodes that substantially penetrate a semiconductor chip or a semiconductor substrate.

SUMMARY

According to an embodiment, a semiconductor device may include a substrate and a through via structure configured to substantially vertically penetrate the substrate. The through via structure may provide a dual path that may include an electrical path and an optical path.

According to an embodiment, a semiconductor device may include a substrate and a through via structure vertically penetrating the substrate. The through via structure may include an electrical path layer and an optical path layer.

According to an embodiment, a semiconductor device may include a substrate and a through via structure vertically penetrating the substrate. The through via structure may include a conductive light penetration layer that may provide both an electrical path and an optical path.

According to an embodiment, a semiconductor device may include a first substrate, a first though via structure vertically penetrating the first substrate and including a first electrical path and a first optical path, a first optical communication unit disposed in the first substrate configured to transmit or receive an optical signal through the first optical path, a second substrate on which the first substrate is stacked, and a second optical communication unit disposed in the second substrate configured to transmit or receive the optical signal through the first optical path.

According to an embodiment, a semiconductor device may include a first substrate, a first though via structure vertically penetrating the first substrate and including a first electrical path and a first optical path, a second substrate on which the first substrate is stacked, and a second though via structure vertically penetrating the second substrate and including a second electrical path and a second optical path. An electrical signal may be propagated through the first and second electrical paths, and an optical signal may be propagated through the first and second optical paths.

According to an embodiment, a memory card may include a semiconductor device. The semiconductor device may include a substrate and a through via structure configured to vertically penetrate the substrate. The through via structure may provide a dual path that includes an electrical path and an optical path.

According to an embodiment, a memory card may include a semiconductor device. The semiconductor device may include a substrate and a through via structure vertically penetrating the substrate. The through via structure may include an electrical path layer and an optical path layer.

According to an embodiment, a memory card may include a semiconductor device. The semiconductor device may include a substrate and a through via structure vertically penetrating the substrate. The through via structure may include a conductive light penetration layer that is configured for providing both an electrical path and an optical path.

According to an embodiment, a memory card may include a semiconductor device. The semiconductor device may include a first substrate, a first though via structure vertically penetrating the first substrate and including a first electrical path and a first optical path, a first optical communication unit disposed in the first substrate configured to transmit or receive an optical signal through the first optical path, a second substrate on which the first substrate is stacked, and a second optical communication unit disposed in the second substrate configured to transmit or receive the optical signal through the first optical path.

According to an embodiment, a memory card may include a semiconductor device. The semiconductor device may include a first substrate, a first though via structure vertically penetrating the first substrate and including a first electrical path and a first optical path, a second substrate on which the first substrate is stacked, and a second though via structure vertically penetrating the second substrate and including a second electrical path and a second optical path. An electrical signal may be propagated through the first and second electrical paths, and an optical signal may be propagated through the first and second optical paths.

According to an embodiment, an electronic system may include a semiconductor device. The semiconductor device may include a substrate and a through via structure configured to vertically penetrate the substrate. The through via structure may provide a dual path that may include an electrical path and an optical path.

According to an embodiment, an electronic system may include a semiconductor device. The semiconductor device may include a substrate and a through via structure vertically penetrating the substrate. The through via structure may include an electrical path layer and an optical path layer.

According to an embodiment, an electronic system may include a semiconductor device. The semiconductor device may include a substrate and a through via structure vertically penetrating the substrate. The through via structure may include a conductive light penetration layer that may provide both an electrical path and an optical path.

According to an embodiment, an electronic system may include a semiconductor device. The semiconductor device may include a first substrate, a first though via structure vertically penetrating the first substrate and including a first electrical path and a first optical path, a first optical communication unit disposed in the first substrate configured to transmit or receive an optical signal through the first optical path, a second substrate on which the first substrate is stacked, and a second optical communication unit disposed in the second substrate configured to transmit or receive the optical signal through the first optical path.

According to an embodiment, an electronic system may include a semiconductor device. The semiconductor device may include a first substrate, a first though via structure vertically penetrating the first substrate and including a first electrical path and a first optical path, a second substrate on which the first substrate is stacked, and a second though via structure vertically penetrating the second substrate and including a second electrical path and a second optical path. An electrical signal may be propagated through the first and second electrical paths, and an optical signal may be propagated through the first and second optical paths.

According to an embodiment, a semiconductor device may include a substrate, and a single through hole penetrating the substrate and may include an electrical path and an optical path within the single through hole.

In an embodiment, a substrate may include single through hole penetrating the substrate and including an electrical path and an optical path within the single through hole, and the single through hole may include an electrical path and an optical path.

According to an embodiment, a memory card may include a semiconductor device. The semiconductor device may include a substrate, and a single through hole penetrating the substrate and may include an electrical path and an optical path within the single through hole.

According to an embodiment, an electronic system may include a semiconductor device. The semiconductor device may include a substrate, and a single through hole penetrating the substrate and may include an electrical path and an optical path within the single through hole.

DETAILED DESCRIPTION OF THE EMBODIMENTS

It will be understood that although the terms first, second, third etc. are used herein to describe various elements, these elements should not be limited by these terms. These terms are only used to distinguish one element from another element. Thus, a first element in some embodiments could be termed a second element in other embodiments without departing from the teachings of the inventive concept.

It will also be understood that when an element is referred to as being "on," "above," "below," or "under" another element, it can be directly "on," "above," "below," or "under" the other element, respectively, or intervening elements may also be present. Accordingly, the terms such as "on," "above," "below," or "under" which are used herein are for the purpose of describing particular embodiments only and are not intended to limit the inventive concept.

It will be further understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion. Semiconductor chips may be obtained by separating a semiconductor substrate such as a wafer into a plurality of pieces using a die sawing process.

The semiconductor chips may correspond to memory chips or logic chips. The memory chips may include dynamic random access memory (DRAM) circuits, static random access memory (SRAM) circuits, flash memory circuits, magnetic random access memory (MRAM) circuits, resistive random access memory (ReRAM or RRAM) circuits, ferroelectric random access memory (FeRAM) circuits, electrical erasable programmable read only memory (EEPROM) circuits or phase change random access memory (PcRAM or PRAM) circuits which are integrated on and/or in the semiconductor substrate. The logic chip may include logic circuits which are integrated on and/or in the semiconduct or substrate. In some cases, the term "semiconductor substrate" used herein may be construed as a semiconductor chip or a semiconductor die in which integrated circuits are formed.

Various embodiments may be directed to semiconductor devices with optical through via structures, memory cards including the same and electronic systems including the same.

A semiconductor device according to an embodiment may include a through via structure that substantially penetrates a substrate, and the through via structure may provide both an electrical path and an optical path. The electrical path may correspond to a conductive line, a conductive wire, or a conductive interconnection that provides a path through which electric signals or electric charges are transmitted. The optical path may correspond to an optical transmission line or a light penetration member that provides a path through which optical signals are transmitted.

The through via structure may substantially penetrate a semiconductor substrate or a semiconductor chip in which integrated circuits are formed. That is, the through via structure may be realized to have a through silicon via (TSV) structure substantially penetrating a substrate. The through via structure may be realized to have a dual-layered structure including two distinct layers; one provides an electrical signal path and the other provides an optical signal path. In such a case, the electrical signal path and the optical signal path may be realized using two different material layers.

The through via structure may be realized to have a dual path structure including an electrical signal path and an optical signal path. In such a case, the through via structure may be realized using a single layer, for example, a conductive light penetration layer that functions as both the electrical signal path and the optical signal path. The conductive light penetration layer may be a material layer having an electric conductivity which is enough to transmit electrical signals and a light permeability which is enough to transmit optical signals. In some embodiments, the conductive light penetration layer may include a conductive polymer material such as a poly(3,4-ethylenedioxythiophene) (PEDOT) material or a poly(3,4-ethylenedioxythiophene) polystyrene sulfonate (PEDOT:PSS) material. Alternatively, the conductive light penetration layer may include a transparent metal layer such as an indium tin oxide (ITO) material.

According to the following embodiments, an optical through via structure providing an optical signal transmission path may be realized to substantially penetrate a semiconductor chip or a semiconductor substrate and to improve a signal transmission speed or a signal propagation speed. In addition, if signals are transmitted through the optical signal path, distortion or attenuation in signals may be remarkably suppressed.

According to the following embodiments, the through via structure may be realized to include both an optical through via structure and an electrical through via structure. In such a case, the electrical through via structure may be used as an electric power supply path and/or an electrical signal transmission path, and the optical through via structure may be used as an optical signal transmission path. The optical through via structure and the electrical through via structure may be disposed in parallel in a single through via hole penetrating a semiconductor chip or a semiconductor substrate. Alternatively, in some embodiments, the electrical through via structure may also be utilized as the optical through via structure. In such cases, the electrical through via structure may function as both the electrical signal transmission path and the optical signal transmission path. Thus, both the electrical signal transmission path and the optical signal transmission path may be realized using only the electrical through via structure in a single through via hole.

Figure 1:
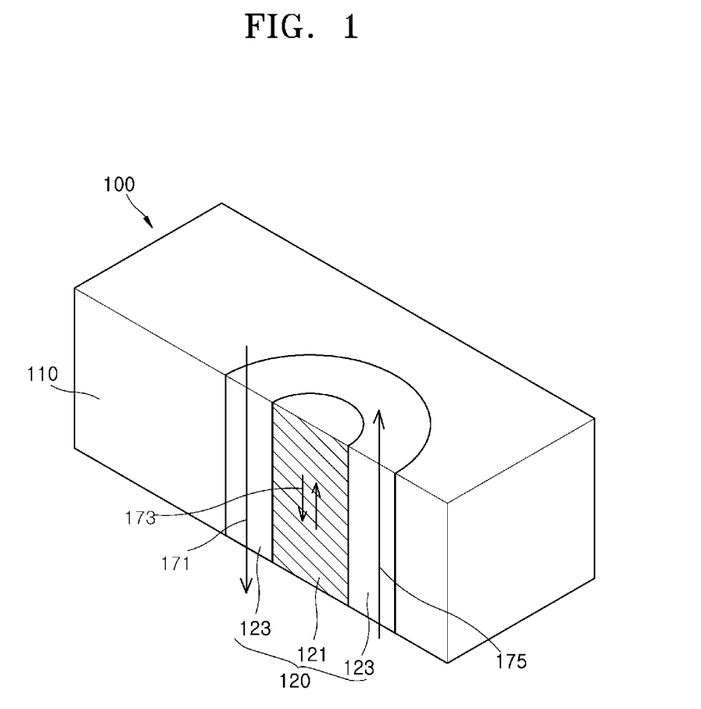
FIG. 1 is a perspective view illustrating a representation of an optical through via structure employed in a semiconductor device according to an embodiment.
Figure 2:
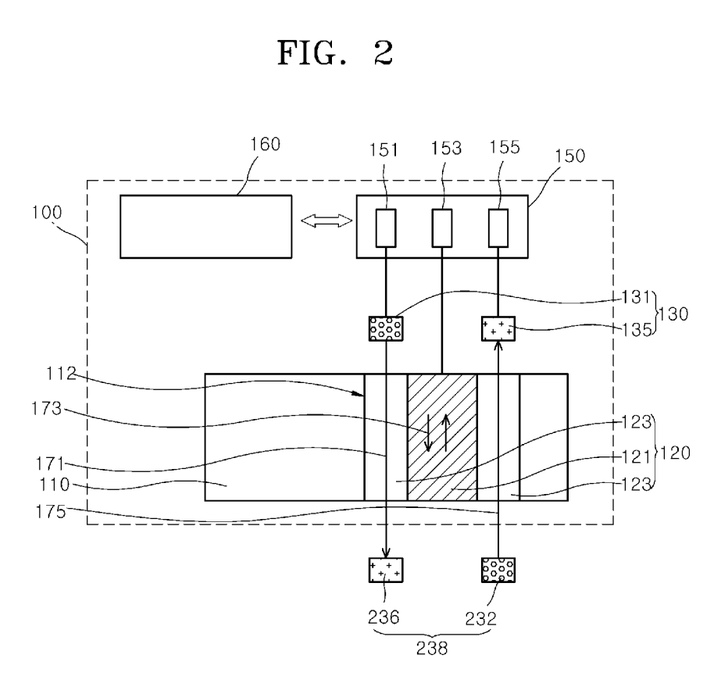
FIG. 2 is a schematic view illustrating a representation of a configuration of a semiconductor device according to an embodiment.
Figure 3:
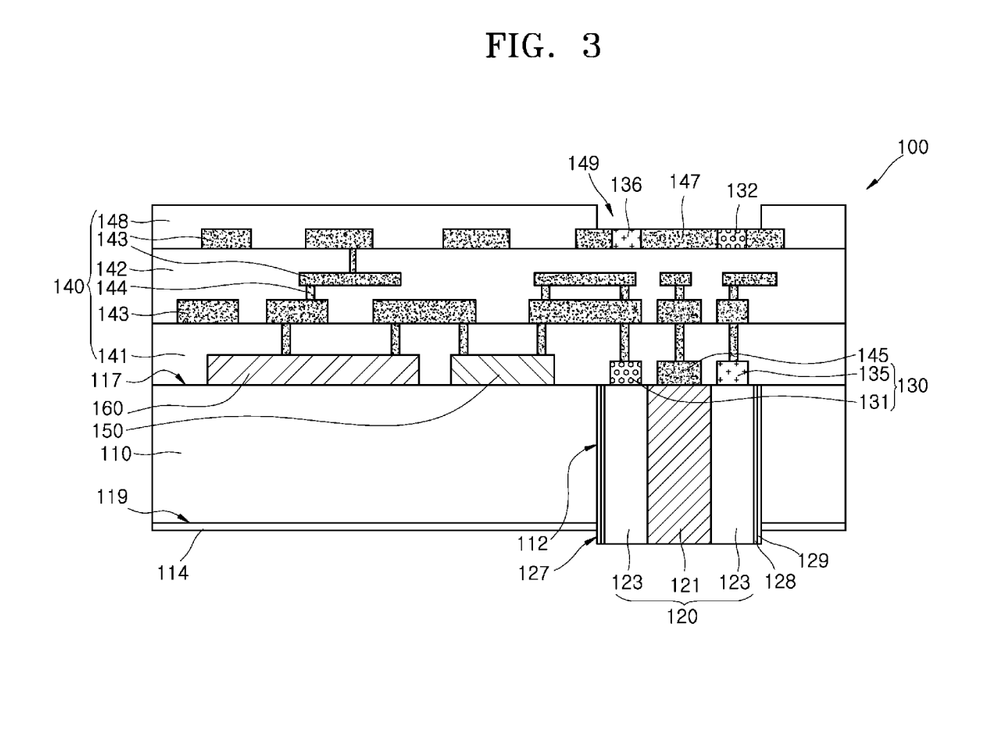
FIG. 3 is a cross-sectional view illustrating a representation of a structure of a semiconductor device according to an embodiment.

FIG. 1 is a perspective view illustrating a representation of an optical through via structure employed in a semiconductor device according to an embodiment. FIG. 2 is a schematic view illustrating a representation of a configuration of a semiconductor device according to an embodiment. FIG. 3 is a cross-sectional view illustrating a representation of a structure of a semiconductor device according to an embodiment.

Referring to FIG. 1, a semiconductor device according to an embodiment may include a substrate 100 and a through via structure 120 vertically penetrating the substrate 100. The substrate 100 may include a substrate body 110. The substrate body 110 may include, for example, a semiconductor material such as a silicon material. The substrate body 110 may be a semiconductor wafer, for example, a single crystalline silicon wafer, an epitaxial wafer or a silicon-on-insulator (SOI) wafer. Metal interconnections, insulation layers or dielectric layers having various shapes may be stacked on the substrate body 110, and various integrated circuits may also be formed on the substrate body 110. The substrate 100 may be construed as, for example, a semiconductor chip, a semiconductor die, a semiconductor substrate or a semiconductor package.

The through via structure 120 may be configured to substantially penetrate the substrate body 110. The through via structure 120 may include both an electrical path layer 121 providing an electrical path 173 and an optical path layer 123 providing optical paths 171 and 175. That is, the through via structure 120 may include a dual path structure having optical paths 171 and 175 and an electrical path 173.

The electrical path layer 121 and the optical path layer 123 may be disposed to vertically extend in parallel or substantially in parallel. For example, the electrical path layer 121 and the optical path layer 123 may be configured to have a coaxial cable shape. That is, the electrical path layer 121 may be located at a central axis position of a through via hole penetrating the substrate body 110, and the optical path layer 123 may be disposed between the electrical path layer 121 and the substrate body 110 to surround a sidewall of the electrical path layer 121. The electrical path layer 121 may have a pillar shape vertically extending from a central region of the through via structure 120. The optical path layer 123 may have a cylindrical shape surrounding a sidewall of the pillar-shaped electrical path layer 121. As described above, both the electrical path layer 121 and the optical path layer 123 surrounding the sidewall of the electrical path layer 121 may vertically extend in parallel or substantially vertically extend in parallel. That is, the through via structure 120 may have a dual-layered structure including two distinct and different material layers; one provides the electrical path 173 and the other provides the optical paths 171 and 175.

The electrical path layer 121 may include a conductive material. For example, the electrical path layer 121 may include a metal layer such as a copper (Cu) layer, a gold (Au) layer, an aluminum (Al) layer, a tin (Sn) layer or a silver (Ag) layer. Alternatively, the electrical path layer 121 may include an alloy layer containing at least one selected from the group consisting of a gold (Au) material, an aluminum (Al) material, a tin (Sn) material and a silver (Ag) material. The optical path layer 123 may include a transparent material, for example, an optical fiber having a low light absorptivity and exhibiting an excellent light transmission efficiency. That is, a transparent conduction layer or a transparent insulation layer may be used as the optical path layer 123.

The optical path layer 123 may include a conductive polymer material such as, for example but not limited to, a poly(3,4-ethylenedioxythiophene) (PEDOT) material or a poly(3,4-ethylenedioxythiophene) polystyrene sulfonate (PEDOT:PSS) material containing a PEDOT material and a polystyrene sulfonate (PSS) material. Alternatively, the optical path layer 123 may include a transparent and inorganic compound layer such as an indium tin oxide (ITO) material. If the optical path layer 123 includes a conductive material, the optical path layer 123 may function as an electrical path as well as an optical path.

If optical signals are transmitted or received through the optical path layer 123, the optical path layer 123 may improve a propagation speed of the optical signals and may remarkably suppress or reduce the distortion or attenuation of the optical signals as compared with general electric signal transmission structures. If the through via structure 120 is configured to include only the optical path layer 123 without the electrical path layer 121, it may be difficult to use the optical path layer 123 as a power voltage supply path and/or a ground voltage supply path. However, according to an embodiment, the through via structure 120 may be configured to include the electrical path layer 121 as well as the optical path layer 123. In such cases, the electrical path layer 121 may be used as the power voltage supply path and the ground voltage supply path as well as an electrical signal transmission path.

Referring to FIG. 2, the semiconductor device according to an embodiment may further include a first optical communication unit 130, a controller 150 and an integrated circuit (IC) part 160 which all may be disposed in the substrate 100. The first optical communication unit 130 may be used in optical communication together with the through via structure 120. The first optical communication unit 130 may be disposed on the substrate body 110 to send or receive optical signals through the optical path layer 123. The first optical communication unit 130 may include a first optical transmitter 131 and a first optical receiver 135. The first optical transmitter 131 may transmit a first light including an optical signal to a first portion of a first end of the optical path layer 123 which is disposed to be adjacent to a sidewall surface 112 of a through hole penetrating the substrate body 110, and the first optical receiver 135 may receive a second light including an optical signal from a second portion of the first end of the optical path layer 123.

The first light may be transmitted through the first optical path 171 and the second light may be received through the second optical path 175. The first optical transmitter 131 of the first optical communication unit 130 may be vertically aligned with the first portion of the first end of the optical path layer 123, and the first optical receiver 135 of the first optical communication unit 130 may be vertically aligned with the second portion of the first end of the optical path layer 123. A second optical communication unit 238 may be disposed on a bottom surface of the substrate body 110 opposite to the first optical communication unit 130. The second optical communication unit 238 may include a second optical transmitter 232 and a second optical receiver 236 to send or receive optical signals through the optical path layer 123, like the first optical communication unit 130. The second optical communication unit 238 may be disposed on or in another substrate which is different from the substrate 100. The second optical receiver 236 may be disposed to be aligned with the first optical transmitter 131, and the second optical transmitter 232 may be disposed to be aligned with the first optical receiver 135. As such, the first and second optical communication units 130 and 238 may be aligned with each other to realize optical communication using the optical path layer 123 providing the optical paths 171 and 175 therebetween.

The first optical transmitter 131 may include, for example, a light emitter such as a light emitting diode (LED), a laser diode, a vertical cavity surface emitting laser (VCSEL), a Fabry-Perot (FP) laser or a distributed feedback (DFB) laser, and the first optical receiver 135 may include a light receiver such as a photo diode or an avalanche photo diode which is capable of converting a light into a current. In some embodiments, the first optical transmitter 131 may include a plurality of light emitters which are capable of generating a plurality of rays having various distinct and different wavelengths, and the first optical receiver 135 may include a plurality of light receivers which are capable of receiving a plurality of rays having various distinct and different wavelengths. Each of the light receivers may include an optical filter through which only a ray having a specific wavelength passes.

The controller 150 may be configured to control overall operations that optical signals or electrical signals are transmitted or received through the first and second optical communication units 130 and 238 and the through via structure 120. In addition, the controller 150 may be configured to control the optical communication between the first optical communication unit 130 and the IC (integrated circuit) part 160. Moreover, the controller 150 may be configured to control the electric power supplied to the IC part 160.

The controller 150 may include a driver 151 controlling an operation of the first optical transmitter 131. The controller 150 may include a detector 155 controlling an operation of the first optical receiver 135. The controller may also include an electric signal transceiver 153 connected to the electrical path layer 121 to control transmission/reception of electrical signals. The controller 150 may be disposed on the substrate body 110 and may be configured to include circuit elements such as transistors. The controller 150 may execute an operation that processes signals outputted from the first optical receiver 135 to transmit the processed signals to the IC part 160. Moreover, the controller 150 may process signals outputted from the IC part 160 to transmit the processed signals to the first optical transmitter 131. In addition, the controller 150 may control electrical communication performed by electrical signals between the IC part 160 and the electrical path layer 121. Furthermore, the controller 150 may control an operation that supplies electric power outputted from the electrical path layer 121 to the IC part 160.

The IC part 160 may be disposed on the substrate body 110 and may be configured to include various circuit elements, for example, transistors and/or capacitors according to a type or a function of the semiconductor device. The semiconductor device may correspond to a memory device or a logic device (i.e., a non-memory device) according to a type or a function of the circuit included in the IC part 160. If the semiconductor device is a memory device, the semiconductor device may be one of a DRAM device, an SRAM device, a flash memory device, an EEPROM device, a PRAM device, an MRAM device and an RRAM device.

Referring to FIG. 3, the IC part 160 may be disposed on a first surface 117 of the substrate body 110. The controller 150 may be disposed on the first surface 117 of the substrate body 110 to be adjacent to the IC part 160. As described with reference to FIG. 2, the IC part 160 may include various circuit elements, for example, transistors and/or capacitors according to a type or a function of the semiconductor device. The IC part 160 and the controller 150 may be covered with a first insulation layer 141. The through via structure 120 may be disposed to cover a sidewall 112 of a through hole penetrating the substrate body 110 and to fill the through hole.

The through via structure 120 may include the electrical path layer 121 providing the electrical path (173 of FIG. 2) and the optical path layer 123 providing the optical paths (171 and 175 of FIG. 2). The electrical path layer 121 and the optical path layer 123 may be disposed to have a coaxial structure. That is, the electrical path layer 121 may have a pillar shape vertically extending from a central point of the through hole penetrating the substrate body 110. The optical path layer 123 may be disposed between the electrical path layer 121 and the substrate body 110 to surround the sidewall of the electrical path layer 121. A barrier metal layer 128 may be additionally disposed between the through via structure 120 and the sidewall 112 to prevent metal atoms or metal ions in the through via structure 120 from being diffused into the substrate body 110. Moreover, a sidewall insulation layer 129 may be additionally disposed between the barrier metal layer 128 and the sidewall 112. That is, the barrier metal layer 128 and the sidewall insulation layer 129 may be disposed to prevent materials of the through via structure 120 from being diffused into the substrate body 110 and to block a leakage current flowing between the through via structure 120 and the substrate body 110. The sidewall insulation layer 129 may be absent in the event that the optical path layer 123 is formed of a polymer insulation layer.

After the optical path layer 123 is formed on the sidewall 112 of the through hole, the electrical path layer 121 may be formed to fill a space surrounded by the optical path layer 123. Accordingly, the optical path layer 123 and the electrical path layer 121 may be formed in parallel to have columnar structures. The electrical path layer 121 may include a metal layer such as, for example but not limited to, a copper (Cu) layer, a gold (Au) layer, an aluminum (Al) layer, a tin (Sn) layer or a silver (Ag) layer. Alternatively, the electrical path layer 121 may include an alloy layer containing, for example but not limited to, at least one selected from the group consisting of a gold (Au) material, an aluminum (Al) material, a tin (Sn) material and a silver (Ag) material.

The optical path layer 123 may include a transparent material, for example, an optical fiber having a low light absorptivity and exhibiting an excellent light transmission efficiency. That is, a transparent conduction layer or a transparent insulation layer may be used as the optical path layer 123. The optical path layer 123 may include a conductive polymer material such as, for example but not limited to, a poly(3,4-ethylenedioxythiophene) (PEDOT) material or a poly(3,4-ethylenedioxythiophene) polystyrene sulfonate (PEDOT: PSS) material containing a PEDOT material and a PSS material. Alternatively, the optical path layer 123 may include a transparent and inorganic compound layer such as, for example but not limited to, an indium tin oxide (ITO) material. If the optical path layer 123 includes a conductive material, the optical path layer 123 may function as an electrical path as well as an optical path.

The first optical communication unit 130 may be disposed to execute an optical communication utilizing the through via structure 120. The first optical transmitter 131 of the first optical communication unit 130 may be disposed on a first portion of a first end of the optical path layer 123 to emit a first light toward the optical path layer 123. The first optical receiver 135 of the first optical communication unit 130 may be disposed on a second portion of the first end of the optical path layer 123 to receive a second light including an optical signal outputted from the optical path layer 123. A first interconnector 145 may be disposed to contact an end of the electrical path layer 121 and may be used as a path through which an electrical signal, a power voltage, or a ground voltage is transmitted or received. The first interconnector 145 may be disposed between the first optical transmitter 131 and the first optical receiver 135. The first interconnector 145 maybe electrically connected to the controller 150, the IC part 160, or other interconnectors through at least one of internal interconnectors 143 and 144 constituting an internal interconnection structure 140 disposed on the first insulation layer 141.

The internal interconnectors 143 and 144 may be disposed in a second insulation layer 142 stacked on the first insulation layer 141. In addition, some of the internal interconnectors 143 and 144 may be disposed on a top surface of the second insulation layer 142 opposite to the first insulation layer 141. The internal interconnectors 143 and 144 may include horizontal interconnectors 143 extending in a horizontal direction and vertical interconnectors 144 that extend in a vertical direction to connect the horizontal interconnectors 143, which are located at different levels, to each other. The internal interconnectors 143 and 144 may be disposed to realize electrical connections among the through via structure 120, the controller 150, the IC part 160, and a fourth interconnector 147. The fourth interconnector 147 may be realized to have a pad shape. The fourth interconnector 147 may be disposed in an opening 149 that penetrates a third insulation layer 148 covering the second insulation layer 142 and the horizontal interconnectors 143 on the second insulation layer 142. The fourth interconnector 147 may be electrically connected to another substrate (not illustrated) or another package substrate (not illustrated). The fourth interconnector 147 may be located at the same level as the horizontal interconnectors 143 on the second insulation layer 142. That is, the fourth interconnector 147 and the horizontal interconnectors 143 on the second insulation layer 142 may be simultaneously formed. A fourth optical communication unit 132 and 136 may be disposed to be adjacent to the fourth interconnector 147. The fourth optical communication unit 132 and 136 may include a fourth optical transmitter 132 and a fourth optical receiver 136. The fourth optical transmitter 132, the fourth optical receiver 136 and the fourth interconnector 147 may be disposed to be adjacent to each other at the same level and may be exposed by the opening 149 that vertically penetrates the third insulation layer 148.

An end 127 of the through via structure 120 opposite to the first optical communication unit 130 may protrude from a second surface 119 of the substrate body 110. The end 127 of the through via structure 120 may downwardly protrude from a bottom surface of a fourth insulation layer 114 covering the second surface 119 of the substrate body 110. The protruded end 127 of the through via structure 120 may be electrically connected to another substrate (not illustrated) or another package substrate (not illustrated).

As described above, a plurality of substrates having the same configurations as the substrate 100 including the through via structure 120 may be vertically stacked to constitute a semiconductor device or a semiconductor package.

Figure 4:
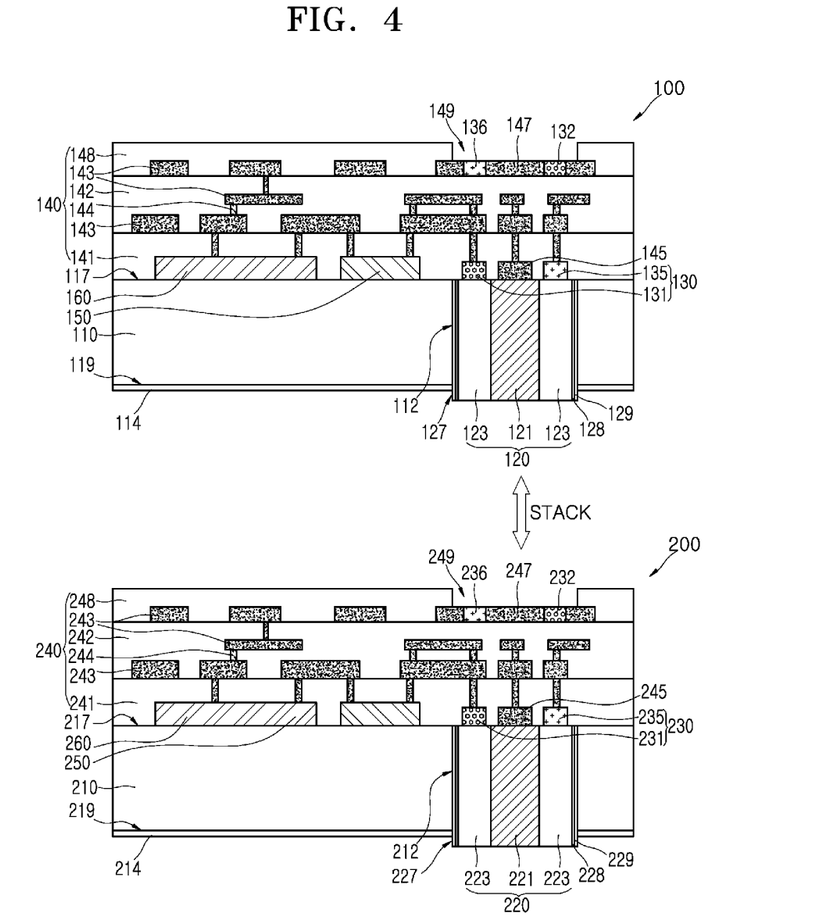
FIGS. 4 and 5 are cross-sectional views illustrating a representation of a semiconductor device according to an embodiment.
Figure 5:
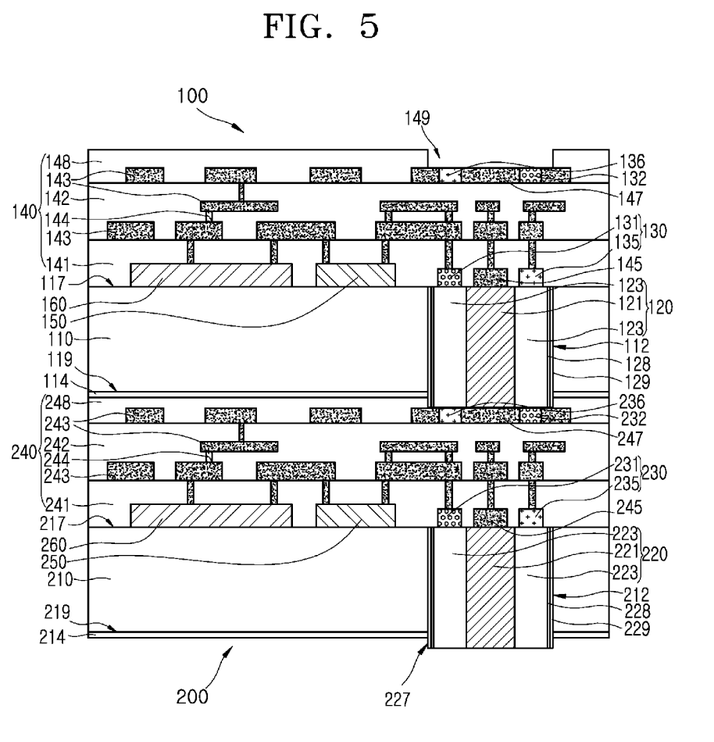
Figure 6:
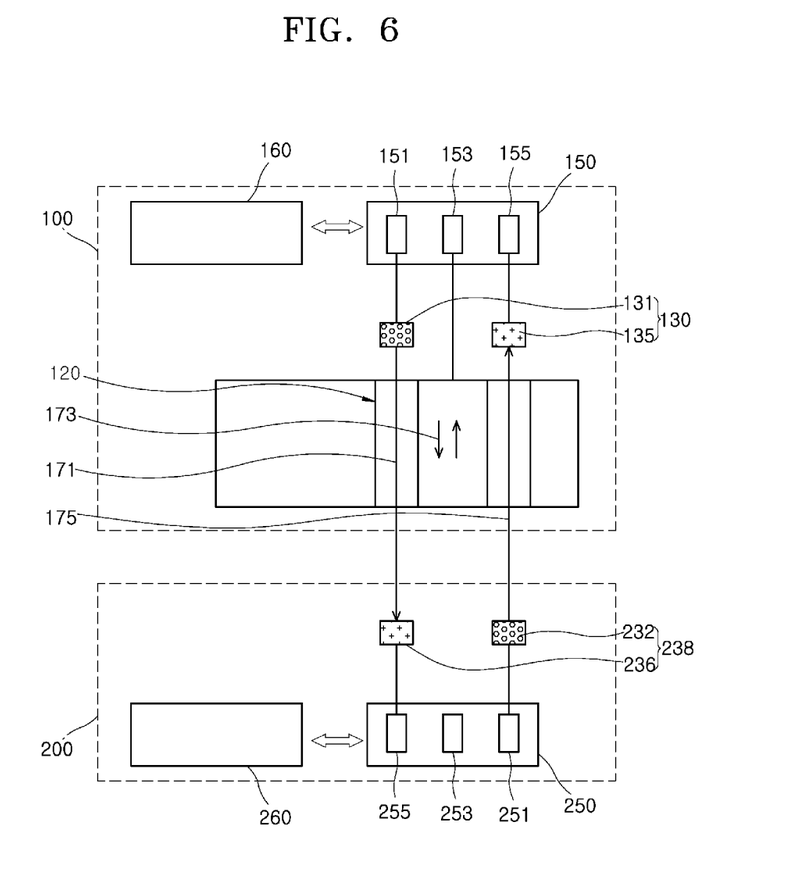
FIG. 6 is a schematic view illustrating a representation of a configuration of the semiconductor device illustrated in FIGS. 4 and 5.

FIGS. 4, 5 and 6 illustrate a semiconductor device according to an embodiment. FIG. 4 is a cross-sectional view illustrating a representation of a first substrate 100 and a second substrate 200 which are separated from each other. FIG. 5 is a cross-sectional view illustrating a representation of the first and second substrates 100 and 200 which are vertically stacked to constitute a semiconductor device according to an embodiment. FIG. 6 is a schematic view illustrating a representation of a configuration of the semiconductor device illustrated in FIGS. 4 and 5.

Referring to FIGS. 4 and 5, the first substrate 100 may include a first substrate body 110, a first IC part 160 comprised of a plurality of circuit elements formed on a first surface 117 of the first substrate body 110, and a first controller 150 disposed on the first surface 117 of the first substrate body 110 to be adjacent to the first IC part 160. The first IC part 160 may be configured to include a plurality of circuit elements, for example, transistors and/or capacitors according to a type or a function of the semiconductor device. The first IC part 160 and the first controller 150 may be covered with a first insulation layer 141. A first through via structure 120 may be disposed to cover a first sidewall 112 of a through hole penetrating the first substrate body 110 and to fill the through hole.

The first through via structure 120 may include both a first electrical path layer 121 providing a first electrical path (173 of FIG. 6) and a first optical path layer 123 providing first optical paths (171 and 175 of FIG. 6). A first barrier metal layer 128 and a first sidewall insulation layer 129 may be additionally disposed between the first through via structure 120 and the first sidewall 112 of the through hole penetrating the first substrate body 110.

A first optical communication unit 130 may include a first optical transmitter 131 and a first optical receiver 135 to execute an optical communication utilizing the first through via structure 120. The first optical transmitter 131 and the first optical receiver 135 may be disposed between the first insulation layer 141 and the first optical path layer 123. A first interconnector 145 may be disposed to contact an end of the first electrical path layer 121. The first interconnector 145 may be electrically connected to the first controller 150, the first IC part 160 or other interconnectors through at least one of first internal interconnectors 143 and 144 constituting a first internal interconnection structure 140 disposed on the first insulation layer 141.

The first internal interconnectors 143 and 144 may be disposed in a second insulation layer 142 stacked on the first insulation layer 141. In addition, some of the first internal interconnectors 143 and 144 may be disposed on a top surface of the second insulation layer 142 opposite to the first insulation layer 141. The first internal interconnectors 143 and 144 may include first horizontal interconnectors 143 extending in a horizontal direction and first vertical interconnectors 144 that extend in a vertical direction to connect the first horizontal interconnectors 143, which are located at different levels, to each other. The first internal interconnectors 143 and 144 may be disposed to realize electrical connections among the first through via structure 120, the first controller 150, the first IC part 160 and a fourth interconnector 147. The fourth interconnector 147 may be realized to have a pad shape. The fourth interconnector 147 may be disposed in a first opening 149 that penetrates a third insulation layer 148 covering the second insulation layer 142 and the first horizontal interconnectors 143 on the second insulation layer 142. The fourth interconnector 147 may be electrically connected to another substrate (not illustrated) or another package substrate (not illustrated). The fourth interconnector 147 may be located at the same level as the first horizontal interconnectors 143 on the second insulation layer 142. That is, the fourth interconnector 147 and the first horizontal interconnectors 143 on the second insulation layer 142 may be simultaneously formed.

A fourth optical communication unit 132 and 136 may be disposed to be adjacent to the fourth interconnector 147. The fourth optical communication unit 132 and 136 may include a fourth optical transmitter 132 and a fourth optical receiver 136. The fourth optical transmitter 132, the fourth optical receiver 136 and the fourth interconnector 147 may be disposed to be adjacent to each other at the same level and may be exposed by the first opening 149 that vertically penetrates the third insulation layer 148.

An end 127 of the first through via structure 120 opposite to the first optical communication unit 130 may protrude from a second surface 119 of the first substrate body 110. The end 127 of the first through via structure 120 may downwardly protrude from a bottom surface of a fourth insulation layer 114 covering the second surface 119 of the first substrate body 110. The protruded end 127 of the first through via structure 120 may be electrically connected to another substrate (not illustrated) or another package substrate (not illustrated).

The second substrate 200 may include a second substrate body 210. The second substrate 200 may also include a second IC part 260 comprised of a plurality of circuit elements formed on a third surface 217 of the second substrate body 210. The second substrate 200 may include a second controller 250 disposed on the third surface 217 of the second substrate body 210 to be adjacent to the second IC part 260. The second IC part 260 may be configured to include a plurality of circuit elements, for example, transistors and/or capacitors according to a type or a function of the semiconductor device. The second IC part 260 and the second controller 250 may be covered with a fifth insulation layer 241. A second through via structure 220 may be disposed to cover a second sidewall 212 of a through hole penetrating the second substrate body 210 and to fill the through hole.

The second through via structure 220 may include both a second electrical path layer 221 providing a second electrical path and a second optical path layer 223 providing second optical paths. A second barrier metal layer 228 and a second sidewall insulation layer 229 may be additionally disposed between the second through via structure 220 and the second sidewall 212 of the through hole penetrating the second substrate body 210.

A third optical communication unit 230 may include a third optical transmitter 231 and a third optical receiver 235 to execute an optical communication utilizing the second through via structure 220. The third optical transmitter 231 and the third optical receiver 235 may be disposed between the fifth insulation layer 241 and the second optical path layer 223. A third interconnector 245 may be disposed to contact an end of the second electrical path layer 221. The third interconnector 245 may be electrically connected to the second controller 250, the second IC part 260 or other interconnectors through at least one of second internal interconnectors 243 and 244 constituting a second internal interconnection structure 240 disposed on the fifth insulation layer 241.

The second internal interconnectors 243 and 244 may be disposed in a sixth insulation layer 242 stacked on the fifth insulation layer 241. In addition, some of the second internal interconnectors 243 and 244 may be disposed on a top surface of the sixth insulation layer 242 opposite to the fifth insulation layer 241. The second internal interconnectors 243 and 244 may include second horizontal interconnectors 243 extending in a horizontal direction and second vertical interconnectors 244 that extend in a vertical direction to connect the second horizontal interconnectors 243, which are located at different levels, to each other. The second internal interconnectors 243 and 244 may be disposed to realize electrical connections among the second through via structure 220, the second controller 250, the second IC part 260 and a second interconnector 247. The second interconnector 247 may be realized to have a pad shape. The second interconnector 247 may be disposed in a second opening 249 that penetrates a seventh insulation layer 248 covering the sixth insulation layer 242 and the second horizontal interconnectors 243 on the sixth insulation layer 242. The second opening 249 may provide a space in which the protruded end 127 of the first through via structure 210 is inserted.

The second interconnector 247 may be located at the same level as the second horizontal interconnectors 243 on the sixth insulation layer 242. That is, the second interconnector 247 and the second horizontal interconnectors 243 on the sixth insulation layer 242 may be simultaneously formed. The first interconnector 145 may contact an end of the first electrical path layer 121 to provide a path through which an electrical signal, a power voltage or a ground voltage is transmitted or received. In addition, the second interconnector 247 may be disposed in the second substrate 200 to contact the protruded end 127 of the first electrical path layer 121 when the first substrate 100 is stacked on the second substrate 200 (see FIG. 5). A second optical communication unit 232 and 236 may be disposed on the sixth insulation layer 242 to be adjacent to the second interconnector 247. The second optical communication unit 232 and 236 may be disposed to send optical signals to the first optical path layer 123 and to receive optical signals outputted from the first optical path layer 123. The second optical communication unit 232 and 236 may be configured to include a second optical transmitter 232 and a second optical receiver 236. The second optical receiver 236 may be aligned with the first optical path layer 123 to receive a first light outputted from the first optical transmitter 131, and the second optical transmitter 232 may be aligned with the first optical path layer 123 to emit a second light toward the first optical receiver 135. The second optical transmitter 232 and the second optical receiver 236 may be adjacent to the second interconnector 247 and may be exposed by the second opening 249.

An end 227 of the second through via structure 220 opposite to the third optical communication unit 230 may protrude from a fourth surface 219 of the second substrate body 210.

The end 227 of the second through via structure 220 may downwardly protrude from a bottom surface of an eighth insulation layer 214 covering the fourth surface 219 of the second substrate body 210. The protruded end 227 of the second through via structure 220 may be electrically connected to another substrate (not illustrated) or another package substrate (not illustrated).

Referring to FIG. 6, the first controller 150 of the first substrate 100 may control transmission of signals between the first optical communication unit 130 and the first IC part 160. That is, the signals outputted from the first IC part 160 may be processed by the first controller 150 and the processed signals may be transmitted to the first through via structure 120 through the first optical communication unit 130. In an embodiment, the signals outputted from the first through via structure 120 may be transmitted to the first controller 150 through the first optical communication unit 130, and the first controller 150 may process the signals outputted from the first optical communication unit 130 or the first through via structure 120 and may transmit the processed signals to the first IC part 160. The first controller 150 may control supply of a power voltage transmitted to the first IC part 160. The first controller 150 may include a first driver 151 controlling an operation of the first optical transmitter 131, a first detector 155 controlling an operation of the first optical receiver 135, and a first electric signal transceiver 153 connected to the first electrical path layer 121 to control transmission/reception of electrical signals.

The second controller 250 of the second substrate 200 may control transmission of signals between the second optical communication unit 238 (232 and 236) and the second IC part 260. That is, the signals outputted from the second IC part 260 may be processed by the second controller 250 and the processed signals may be transmitted to the first through via structure 120 through the second optical communication unit 238. In an embodiment, the signals outputted from the first through via structure 120 may be transmitted to the second controller 250 through the second optical communication unit 238, and the second controller 250 may process the signals outputted from the second optical communication unit 238 and may transmit the processed signals to the second IC part 260. The second controller 250 may control supply of a power voltage transmitted to the second IC part 260. The second controller 250 may include a second driver 251 controlling an operation of the second optical transmitter 232, a second detector 255 controlling an operation of the second optical receiver 236, and a second electric signal transceiver 253 connected to the first electrical path layer 121 to control transmission/reception of electrical signals.

Referring again to FIG. 5, the second controller 250 may be configured to control optical signals and electrical signals between the first substrate 100 and the second substrate 200. In addition, the second controller 250 may be configured to control optical signals and electrical signals which are transmitted or received through the second through via structure 220. Moreover, the second controller 250 may be configured to control transmission of signals between the third optical communication unit 230 and the second IC part 260. Furthermore, the second controller 250 may be configured to control supply of a power voltage which is transmitted to the second IC part 260.

The second driver (251 of FIG. 6) of the second controller 250 may control an operation of the third optical transmitter 231. The second detector (255 of FIG. 6) of the second controller 250 may control an operation of the third optical receiver 235. In addition, the second electric signal transceiver (253 of FIG. 6) of the second controller 250 may control transmission/reception of electrical signals. The second controller 250 may be disposed on the second substrate body 210 and may be configured to include circuit elements such as transistors. The second controller 250 may process signals outputted from the third optical receiver 235 and may transmit the processed signals to the second IC part 260. The second controller 250 may process signals outputted from the second IC part 260 and may transmit the processed signals to the third optical transmitter 231. Moreover, the second controller 250 may control electrical signals transmitted between the second IC part 260 and the second electrical path layer 221. In addition, the second controller 250 may control a power voltage supplied to the second IC part 260 through the second electrical path layer 221.

The first substrate 100 including the first through via structure 120 may be stacked on the second substrate 200 including the second through via structure 220. The first and second substrates 100 and 200 may constitute a semiconductor device. Although FIGS. 4, 5 and 6 illustrate an example in which the first and second substrates 100 and 200 are stacked to constitute a semiconductor device, the embodiments are not limited thereto. For example, at least one additional substrate having substantially the same configuration as the first or second substrate 100 or 200 may be stacked on a top surface of the first substrates 100 opposite to the second substrate 200 or a bottom surface of the second substrate 200 opposite to the first substrate 100 to constitute a semiconductor device.

Figure 7:
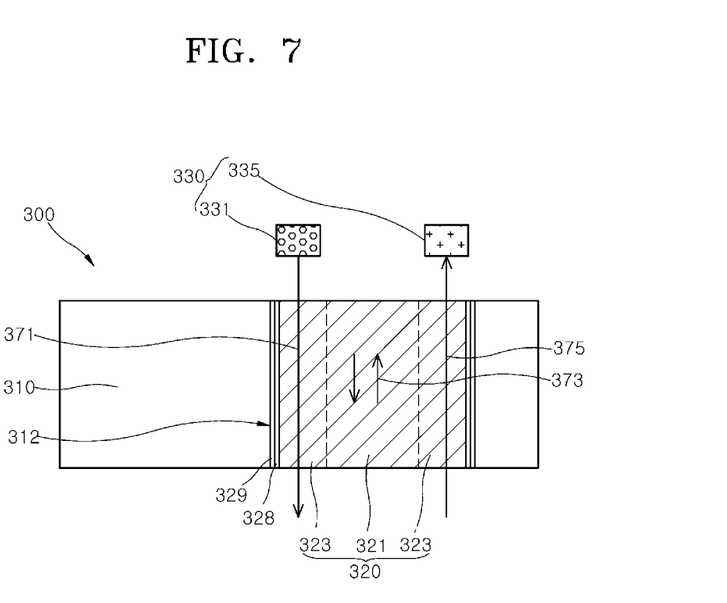
FIG. 7 is a schematic view illustrating a representation of a configuration a semiconductor device according to an embodiment.

FIG. 7 is a schematic view illustrating a representation of a configuration of a semiconductor device according to an embodiment.

Referring to FIG. 7, a semiconductor device according to an embodiment may include a substrate 300. The substrate 300 may include a substrate body 310 and a through via structure 320 vertically penetrating the substrate body 310. The through via structure 320 may include an electrical path layer 321 providing an electric path 373 and an optical path layer 323 providing optical paths 371 and 375. Both the electrical path layer 321 and the optical path layer 323 may be comprised of a conductive light penetration layer. That is, a dual path structure having the optical paths 371 and 375 and the electrical path 373 may be disposed in a single conductive light penetration layer.

The conductive light penetration layer having the optical paths 371 and 375 and the electrical path 373 may include a conductive polymer material such as, for example but not limited to, a PEDOT material or a PEDOT:PSS material containing a PEDOT material and a PSS material. Alternatively, conductive light penetration layer may include a transparent and inorganic compound layer such as, for example but not limited to, an indium tin oxide (ITO) material.

The conductive light penetration layer has an electrical conductivity as well as a light permeability. Thus, an optical signal emitted from an optical transmitter 331 constituting an optical communication unit 330 may be propagated through the through via structure 320 or another optical signal may be propagated through the through via structure 320 to reach an optical receiver 335 constituting the optical communication unit 330. In addition, an electrical signal or a power voltage signal may also be propagated through the through via structure 320. Accordingly, all of an optical signal, an electrical signal, a power voltage signal and a ground voltage signal may be propagated through the through via structure 320 which is formed of a single conductive light penetration layer. A barrier metal layer 328 and a sidewall insulation layer 329 may be additionally disposed between a sidewall of the through via structure 320 and a sidewall 312 of a through hole penetrating the substrate body 310.

Figure 8:
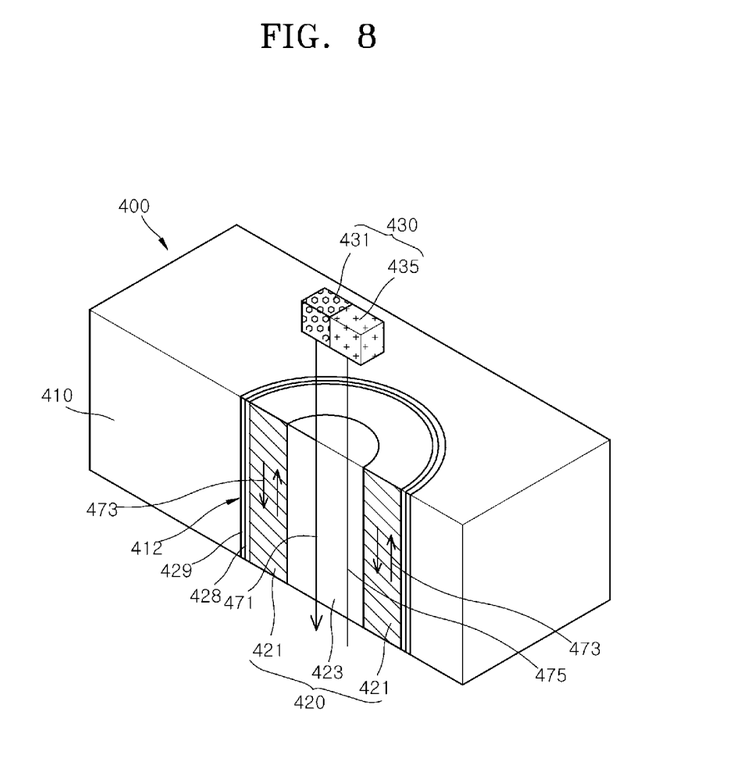
FIG. 8 is a perspective view illustrating a representation of a semiconductor device according to an embodiment.

FIG. 8 is a perspective view illustrating a representation of a semiconductor device according to an embodiment.

Referring to FIG. 8, a semiconductor device according to an embodiment may include a substrate 400, and the substrate 400 may include a substrate body 410 and a through via structure 420 vertically penetrating the substrate body 410. The through via structure 420 may include an electrical path layer 421 providing an electric path 473 and an optical path layer 423 providing optical paths 471 and 475. According to an embodiment, the optical path layer 423 may be located at a central axis position of a through hole penetrating the substrate body 410. The electrical path layer 421 may be disposed between the optical path layer 423 and the substrate body 410 to surround a sidewall of the optical path layer 423. That is, the optical path layer 423 may have a pillar shape vertically extending from a central region of the through hole penetrating the substrate body 410, and the electrical path layer 421 may have a cylindrical shape surrounding a sidewall of the pillar-shaped optical path layer 423. A barrier metal layer 428 and a sidewall insulation layer 429 may be additionally disposed between a sidewall of the through via structure 420 and a sidewall 412 of the through hole penetrating the substrate body 410.

An optical signal emitted from an optical transmitter 431 constituting an optical communication unit 430 may be propagated through the optical path layer 423, and another optical signal may be propagated through the optical path layer 423 to reach an optical receiver 435 constituting the optical communication unit 430. In addition, an electrical signal or a power voltage signal may be propagated through the electrical path layer 421.

Figure 9:
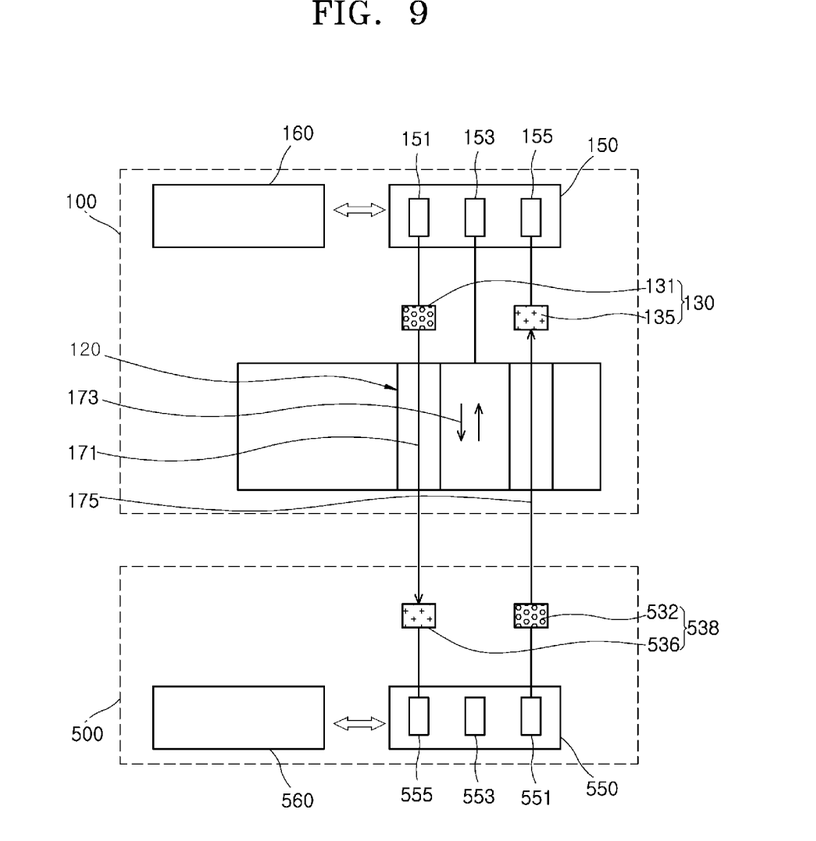
FIG. 9 is a schematic view illustrating a representation of a configuration a semiconductor device according to an embodiment.

FIG. 9 is a schematic view illustrating a representation of a configuration of a semiconductor device according to an embodiment.

Referring to FIG. 9, a semiconductor device according to an embodiment may include the first substrate 100 and a package substrate 500. The first substrate 100 may be stacked on the package substrate 500 to optically and electrically communicate with the package substrate 500 through the through via structure 120 in the first substrate 100. In addition, the first substrate 100 may receive a power voltage signal through the through via structure 120. The first controller 150 of the first substrate 100 may control transmission of signals between the first optical communication unit 130 and the first IC part 160. The first controller 150 may control supply of a power voltage transmitted to the first IC part 160. The first controller 150 may include the first driver 151 controlling an operation of the first optical transmitter 131, the first detector 155 controlling an operation of the first optical receiver 135, and the first electric signal transceiver 153 connected to the first electrical path layer 121 to control transmission/reception of electrical signals.

The package substrate 500 may include a third controller 550 to control various signals which are propagated through the through via structure 120. The third controller 550 may include a third driver 551 controlling an operation of a fifth optical transmitter 532 constituting a fifth optical communication unit 538 disposed in the package substrate 500. The third controller 550 may include a third detector 555 controlling an operation of the fifth optical receiver 536 constituting the fifth optical communication unit 538. The third controller 550 may also include a third electric signal transceiver 553 controlling transmission of electrical signals and supply of a power voltage signal. The third controller 550 may control transmission of signals between the fifth optical communication unit 538 and a substrate circuit part 560 disposed in the package substrate 500. The substrate circuit part 560 may be disposed in the package substrate 500 to communicate with an external device. The substrate circuit part 560 may be configured to function as an interface.

Figure 10:
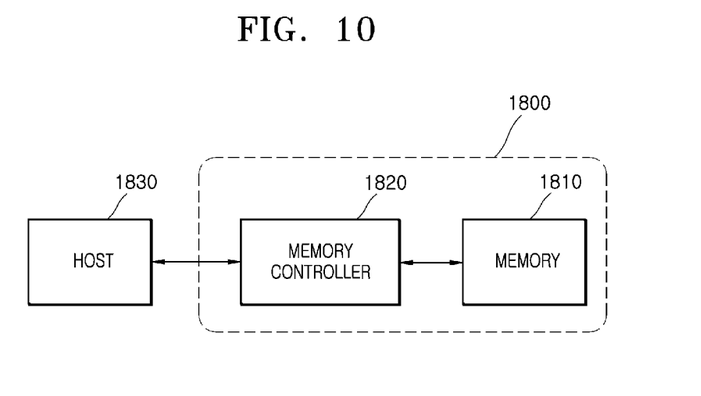
FIG. 10 is a block diagram illustrating a representation of an electronic system including at least one of semiconductor devices according to an embodiment.

FIG. 10 is a block diagram illustrating a representation of an electronic system including a memory card 1800 including at least one of the semiconductor devices according to the above embodiments. Referring to FIG. 10, the memory card 1800 may include a memory 1810 such as a nonvolatile memory device and a memory controller 1820. The memory 1810 and the memory controller 1820 may store data or read out stored data.

At least one of the memory 1810 and the memory controller 1820 may include a nonvolatile memory device including the technology of the embodiments discussed above. The memory controller 1820 may control the memory 1810 such that stored data is read out or data is stored in response to a read/write request from a host 1830.

Figure 11:
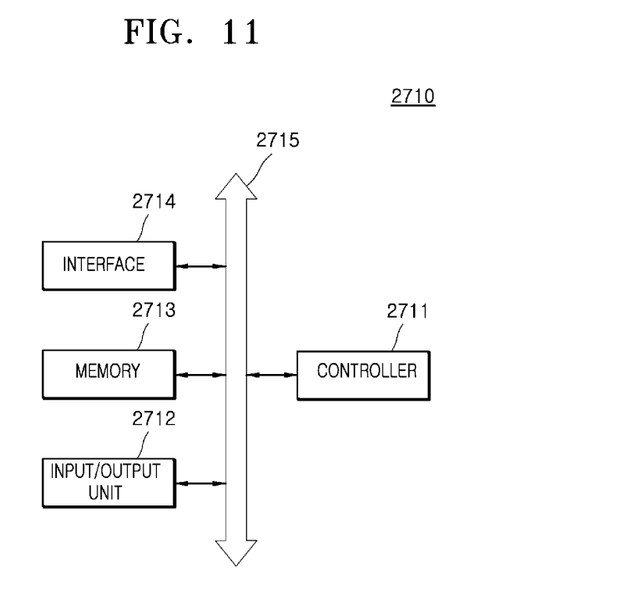
FIG. 11 is a block diagram illustrating a representation of an electronic system including at least one of semiconductor devices according to an embodiment.

FIG. 11 is a block diagram illustrating a representation of an electronic system 2710 including at least one of the semiconductor devices according to the above embodiments. Referring to FIG. 11, the electronic system 2710 may include a controller 2711, an input/output device 2712, and a memory 2713. The controller 2711, the input/output device 2712 and the memory 2713 may be coupled with one another through a bus 2715 providing a path through which data move.

In an embodiment, the controller 2711 may include at least any one of at least one microprocessor, at least one digital signal processor, at least one microcontroller, and logic devices capable of performing the same functions as these components. The controller 2711 or the memory 2713 may include at least any one of the semiconductor devices according to the embodiments discussed above. The input/output unit 2712 may include at least one selected among a keypad, a keyboard, a display device, a touchscreen and so forth. The memory 2713 is a device for storing data. The memory 2713 may store data and/or commands to be executed by the controller 2711, and the likes.

The memory 2713 may include a volatile memory device such as a DRAM and/or a nonvolatile memory device such as a flash memory. For example, a flash memory may be mounted to an information processing system such as a mobile terminal or a desk top computer. The flash memory may constitute a solid state disk (SSD). In these cases, the electronic system 2710 may stably store a large amount of data in a flash memory system.

The electronic system 2710 may further include an interface 2714 configured to transmit and receive data to and from a communication network. The interface 2714 may be a wired or wireless type. For example, the interface 2714 may include an antenna or a wired or wireless transceiver.

The electronic system 2710 may be realized as a mobile system, a personal computer, an industrial computer or a logic system performing various functions. For example, the mobile system may be any one of, for example but not limited to, a personal digital assistant (PDA), a portable computer, a tablet computer, a mobile phone, a smart phone, a wireless phone, a laptop computer, a memory card, a digital music system and an information transmission/reception system.

If the electronic system 2710 is an equipment capable of performing wireless communication, the electronic system 2710 may be used in a communication system such as, for example but not limited to, one of CDMA (code division multiple access), GSM (global system for mobile communications), NADC (north American digital cellular), E-TDMA (enhanced-time division multiple access), WCDAM (wideband code division multiple access), CDMA2000, LTE (long term evolution) and Wibro (wireless broadband Internet).

The embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor device comprising:
   a substrate; and
   a single through hole penetrating the substrate and including an electrical path layer and an optical path layer within the single through hole,
   wherein the electrical path layer is located at a central axis position of the through hole; and
   wherein the optical path layer is disposed between a sidewall of the electrical path layer and a sidewall of the through hole.

2. A semiconductor device comprising:
   a substrate; and
   a through via structure vertically penetrating the substrate and including an electrical path layer and an optical path layer,
   wherein the optical path layer includes a transparent conduction layer.

3. The semiconductor device of claim 2, wherein the electrical path layer and the optical path layer of the through via structure are disposed in a single through hole penetrating the substrate.

4. The semiconductor device of claim 2, wherein the electrical path layer and the optical path layer substantially vertically extend in parallel to constitute a coaxial structure.

5. The semiconductor device of claim 2,
   wherein the electrical path layer is located at a central axis position of a through hole penetrating the substrate; and
   wherein the optical path layer is disposed between a sidewall of the electrical path layer and a sidewall of the through hole.

6. The semiconductor device of claim 2,
   wherein the optical path layer is located at a central axis position of a through hole penetrating the substrate; and
   wherein the electrical path layer is disposed between a sidewall of the optical path layer and a sidewall of the through hole.

7. The semiconductor device of claim 2, wherein the optical path layer includes a conductive polymer layer.

8. The semiconductor device of claim 2, wherein the optical path layer includes any one selected from the group consisting of a poly(3,4-ethylenedioxythiophene) material and a poly(3,4-ethylenedioxythiophene) polystyrene sulfonate material.

9. The semiconductor device of claim 2, wherein the optical path layer includes a transparent and inorganic compound material.

10. The semiconductor device of claim 9, wherein the optical path layer includes an indium tin oxide (ITO) material.

11. The semiconductor device of claim 2, wherein the electrical path layer includes any one selected from the group consisting of a copper (Cu) layer, a gold (Au) layer, an aluminum (Al) layer, a tin (Sn) layer and a silver (Ag) layer.

12. The semiconductor device of claim 2, wherein the electrical path layer includes an alloy layer or a metal layer.

13. The semiconductor device of claim 2, further comprising an optical communication unit configured to transmit or receive an optical signal through the optical path layer.

14. The semiconductor device of claim 13, wherein the optical communication unit includes:
    an optical transmitter configured to transmit a first light including an optical signal to a first portion of a first end of the optical path layer; and
    an optical receiver configured to receive a second light including an optical signal outputted from a second portion of the first end of the optical path layer.

15. The semiconductor device of claim 14, wherein the first light including the optical signal has a different wavelength than the second light including the optical signal.

16. The semiconductor device of claim 14, further comprising a first optical communication unit configured to transmit or receive the optical signal through the optical path layer, the first optical communication unit includes:
    a first optical transmitter configured to transmit the second light including the optical signal to the second portion of a second end of the optical path layer; and
    a first optical receiver configured to receive the first light including the optical signal from the first portion of the second end of the optical path layer.

17. The semiconductor device of claim 12, further comprising:
    an integrated circuit part disposed in the substrate; and
    a controller disposed in the substrate configured to control the electrical signal transmitted between the integrated circuit part and the through via structure, the optical signal transmitted between the integrated circuit part and the through via structure, or the power voltage signal transmitted between the integrated circuit part and the through via structure.

18. A semiconductor device comprising:
    a substrate; and
    a through via structure vertically penetrating the substrate and including a conductive light penetration layer that provides both an electrical path and an optical path.

* * * * *